United States Patent [19]

Bonhomme

[11] 4,169,644

[45] Oct. 2, 1979

[54] ELECTRICAL CONNECTION DEVICES

[76] Inventor: François R. Bonhomme, 6 Parc de Bearn, Saint Cloud, France

[21] Appl. No.: 845,639

[22] Filed: Oct. 26, 1977

Related U.S. Application Data

[63] Continuation-in-part of Ser. No. 665,864, Mar. 11, 1976, abandoned.

[30] Foreign Application Priority Data

Jul. 12, 1977 [FR] France ................................ 77 21404

[51] Int. Cl.[2] ......................... H01R 13/54; H05K 1/12

[52] U.S. Cl. ............................. 339/75 MP; 339/17 L; 339/176 MP

[58] Field of Search .............. 339/17 L, 74 R, 75 MP, 339/91 R, 176 MP

[56] References Cited

U.S. PATENT DOCUMENTS

| | | | |
|---|---|---|---|
| 3,329,926 | 7/1967 | Aksu et al. | 339/176 MP |
| 3,818,419 | 6/1974 | Crane | 339/176 MP X |
| 3,997,231 | 12/1976 | Sherwood | 339/176 MP X |

*Primary Examiner*—E. F. Desmond

*Attorney, Agent, or Firm*—John A. Young

[57] ABSTRACT

An electrical connection device, particularly but not exclusively for printed circuit boards, consists of a rigid insulating support for receiving a board, resilient contact members each having one end fixed relative to the support and adapted to engage resiliently, through an active region of the contact member, a respective one of a number of conductive connection tracks on the board, and a control mechanism operable alternately to open and close the contact members to allow insertion and extraction of the board. The control mechanism comprises at least one slide movable in the rigid support and each contact member comprises, between a portion forming a hinge and a movable end held or joined in fixed position in the slide, two substantially rectilinear portions which are inclined to one another and to the direction of translation of the slide and which are guided transversely by the slide, the junction of the two portions forming the active region of the contact member.

27 Claims, 28 Drawing Figures

ELECTRICAL CONNECTION DEVICES

RELATED APPLICATIONS

This application is a continuation-in-part of Application Ser. No. 665,864 filed Mar. 11, 1976 and titled, "ELECTRICAL CONNECTION DEVICES", now abandoned.

BACKGROUND OF THE INVENTION

The invention relates to an electrical connection device, comprising a first rigid insulating support relative to which there can be guided, parallel to a direction of introduction and extraction, a second rigid insulating support provided with conducting connection tracks, and which carries, on the one hand, resilient contact members each having one end fixed relative to the first support and adapted to engage resiliently, through an active region of the contact member, with a suitable resilient force, a respective one of the conducting connection tracks on the second support when one of the two supports has been introduced inside the other, and on the other hand a control mechanism operable to act on the resilient contact members alternately in a sense causing opening of the contacts and a sense causing closing of the contacts. The invention relates more particularly, but not exclusively, to connection devices for printed circuit boards, the first support then consisting of a frame in which there can be guided a printed circuit board forming the second support. In order to simplify the description, the invention will be described hereinafter essentially in this mode of application.

The above-mentioned mechanism provides a solution to the problem of "opening" the contact members just before and during the introduction of any board into the connection device and just before and during the extraction of such a board from the device, that is to say the problem of removing the active regions of the contact members from the volume then swept by this board, in such a manner as to make substantially zero the force necessary for the introduction or the extraction of the board and to relieve from all wear by friction the protective coverings both of the contact members and of the conducting connection tracks of the board. Of course, once the board has reached its working position, the mechanism in question "closes" the contact members, that is to say causes them to bear resiliently through their active regions against the corresponding connecting tracks of the board, which tracks are generally provided on both faces of the board.

DESCRIPTION OF PRIOR ART

Connection devices of the type defined above have already been described in the U.S. journal, "IBM Technical Disclosure Bulletin", Vol. 10, No. 11, April 1968, page 1656, and in U.S. Pat. No. 3,744,005. In both cases, each resilient contact member is grasped with play by a push-piece movable in translation. In view of the fact that the direction of action of this push-piece is perpendicular to the mean plane of the frame, that is to say to the mean plane of the board when this board is in the working position, the active region of the contact member (consisting of its free end according to the first document and of an intermediate portion according to the second document) comes to bear against the connecting track of the board without wiping this track locally, that is to say without being able to dislodge, by a relative movement, the insulating dust which may happen to have settled on this track and/or on the active region of the contact member. Now such dust is liable to prevent the passage of electric currents of low intensity. This is why these known connection devices do not meet the present requirements of users of printed circuit boards because they do not ensure self-cleaning of the contact regions. Moreover, the play to which the contact members are subjected in their push-piece may cause difficulties in operation if the connection device is exposed to vibrations which, being transmitted to the contact members, risk removing these momentarily from the connecting tracks which they should bear against permanently through their active region with a constant resilient force.

SUMMARY OF THE INVENTION

An object of this invention is to eliminate the disadvantages of the known devices.

According to this invention there is provided an electrical connection device comprising a first rigid insulating support relative to which there can be guided, parallel to a direction of introduction and extraction, a second rigid insulating support provided with conducting connection tracks, and which carries, on the one hand, resilient contact members each having one end fixed in relation to the first support and adapted to engage resiliently, through an active region of the contact member, a respective one of the conducting connection tracks on the second support respectively when one of the two supports has been introduced inside the other and, on the other hand, a control mechanism operable to act on the resilient contact members alternately in a sense causing opening of the contacts and a sense causing closing of the contacts, in which the control mechanism comprises at least one movable slide and each contact member comprises, between a portion forming a hinge and a movable end inserted in the slide, two substantially rectilinear portions which are inclined to one another and to the direction of translation of the slide and which are guided transversely by the slide, the junction of the two portions constituting an active region of the contact member.

Preferably, the movable end of the contact member is fixedly held engaged in an inserted seating, provided for this purpose in the slide, under the effect of a prestressing force stored in the portion of said member forming a hinge. This portion forming a hinge may consist of a loop or a single turn.

It is then possible to construct on the contact member of the device of this invention a deformable triangle, two sides of which are constituted by its two substantially rectilinear portions and the third side of which, is imaginary, and connects the portion forming a hinge to the inserted end. The first two sides have a length which is substantially constant while the third or imaginary side has a variable length depending on the position of the slide. In the open condition of the contact, the slide occupies such a position that the imaginary side of the triangle has its maximum length and that, in consequence, the height of the triangle based on this imaginary side is at a minimum. In other words, the apex of the triangle opposite to this imaginary side (that is to say the active region of the contact member) is relatively close to the slide, and hence relatively far away from the printed circuit board. If the slide is now displaced in the required direction, it pushes against the inserted end of the contact member, which shortens the imaginary side of the triangle and increases the height dropped on this imaginary side. The active region of the contact member then progressively approaches the board to come first into linear contact with the corresponding connecting track, then to spread out into surface engagement while sliding on this track, which ensures the self-cleaning of the contact regions. In embodiments of the invention in which the portion forming the hinge consists of a loop or turn, this self-cleaning effect, due to the displacement of the active region of the contact member, is enhanced by the presence of the loop or turn, which increases in diameter. The portion of the contact member adjacent to the loop coils slightly in said loop, which shortens its free length and therefore enhances the displacement of the active region of the contact member. At the end of the movement of the slide, the active region of the contact member is bearing against the connecting track with a force which depends, *inter alia,* on the amplitude of the displacement of the slide. If the slide is now displaced in the opposite direction, it pulls on the inserted end of the contact member, which simultaneously causes the portion adjacent to the loop to resume its initial length (which loop diminishes in diameter on account, on the one hand, of the energy stored in this loop in the course of the previous closing operation and, on the other hand, of the action of the slide which tends to close this loop further), in the open condition, the contact enlarges the imaginary side of the triangle and sets back the active region of the contact member in relation to the connecting track. It should be noted that the deformation of the contact member is caused solely by the displacement of the slide without involving the resilience of the metal of the contact member. In the course of the movements of the slide, the loop or turn tightens the hinge against the adjacent portion of the contact member.

It may be noted that the U.S. Pat. No. 3,329,926 describes a connection device, for printed circuit boards, the contact members of which comprise a slightly curved portion between a fold serving as a fixed support and a free end on which a slide acts solely by thrust. The displacement of this slide in one direction increases the curvature of said portion and therefore causes the center of this portion to project to bear against the corresponding connecting track. Although this patent does not make any reference to the manner in which the contact members open, it may be assumed that it is under the effect of their own resilience since the slide can only act by thrust. In such a connection device, it is difficult to master the deformations of the contact member in view, in particular, of the low value of the initial curvature and the absence of a loop or turn forming a hinge. Moreover, since the opening of each contact member is apparently only due to its own resilience, this limits considerably the amplitude of the deformation to which such a member can be subjected; consequently, this limits to the same extent the resilient force applying its active region on the connecting track and, what is even more important, the self-cleaning action which can be expected of it. In contrast, according to the invention, the amplitude of deformation can be much greater and may even exceed the limit of permanent deformation because the slide acts in both directions on the inserted end of the contact member, the resilience of which is utilized essentially to exert the resilient contact force on the active region.

A preferred feature of the invention enables an improvement in the self-cleaning capacity of the contact members.

For this purpose, the slide and the contact member are adapted in such a manner that, when the slide executes a displacement in the direction tending to close the contact members, it grasps, in the course of this displacement, a portion of the contact member which is entrained with it during the end of this displacement. Preferably, the two inclined portions of each contact member are connected by a single turn which forms both the active region and a supporting surface for a shoulder carried by the slide to enable it to grasp and entrain this turn. According to a modification, the contact member comprises successively, between its fixed end and the portion forming a hinge, a flexibility fold and a portion inserted in a support which is guided in translation parallel to the slide and which is urged towards a stop in the direction of the opening movement of the slide, the whole being such that, during the closing movement of the slide, the support first rests on its stop until the active region of the contact member touches the connecting track of the board, after which the slide entrains the insulating support by thrust while retaining the relative position of the two inclined portions in relation to the slide.

In my earlier described connector device, one of the ends of each contact member is anchored in the slide. Since the printed circuit board must be able to arrive beyond this end to reach the active region of the contact member, the slide can only be situated outside of the insertion and extraction plane and the control mechanism hence comprises necessarily two slides symmetrical with one another with respect to this plane and spaced from one another. The presence of these two slides necessarily increases the overall thickness of the connection device, which is troublesome for many applications.

It is a further object of the invention to render connection devices of the type defined above, such that they overcome certain drawbacks of my earlier described devices and in particular so that their thickness may be reduced.

To achieve this purpose, the connection device according to improvements of the invention is essentially characterized in that, on each contact member, the hinge-forming portion is constituted by the second end of this member and in that the anchoring portion, fixed with respect to the slide, is separated from this second end by the two approximately rectilinear inclined portions. By "second end", is meant here the end of the contact member which is opposite the "first end", that is to say that which was defined above as being fixedly held in the frame.

Preferably, the connection device comprises a single slide which is symmetrical with respect to the insertion and extraction plane and to the two surfaces of which are fixed the anchoring portions or the contact members.

In a particularly advantageous embodiment, each contact member is constituted by a metal wire and the slide and/or the frame possess guide means which act on its approximately rectilinear portions so as to hold them constantly in the same plane. In this case, the hinge-forming end of the wire is, preferably, folded approximately at right-angles with respect to the insertion and extraction plane, away from the latter, and is introduced into a hole formed for this purpose in the frame.

The distance which exists between the first end of each contact member, fixed with respect to the frame, and its anchoring portion varies necessarily according to the position of the slide. To take this fact into account, each contact member advantageously comprises, between its first end and its anchoring portion, a portion deformable in a plane perpendicular to the insertion and extraction plane. To avoid these deformable portions from touching each other in the course of the manipulations of the connection device, the slide is advantageously provided with an insulating plate lying in the insertion and extraction plane, at the level of the deformable portions of the contact members.

Lastly, it is advantageous to arrange the control mechanism so that it comprises two sliding strips fast to one another and guided in translation with respect to the frame, these sliding strips being provided with oblique slots in which an axle fast to the slide is engaged and held so as to be movable only parallel to the translation movement of the slide. This construction helps to limit the overall thickness of the connection device.

The invention relates not only to the above-defined connection devices, but also to the contact members and slides designed to be incorporated to these connection devices.

As is apparent from the above, the invention renders it possible to produce not only connectors for printed circuit boards, but also cylindrical or rectangular plug-in connectors, with similar advantages.

The invention will now be described in more detail with the aid of the accompanying drawings.

DESCRIPTION OF PREFERRED EMBODIMENTS

Figure 1:
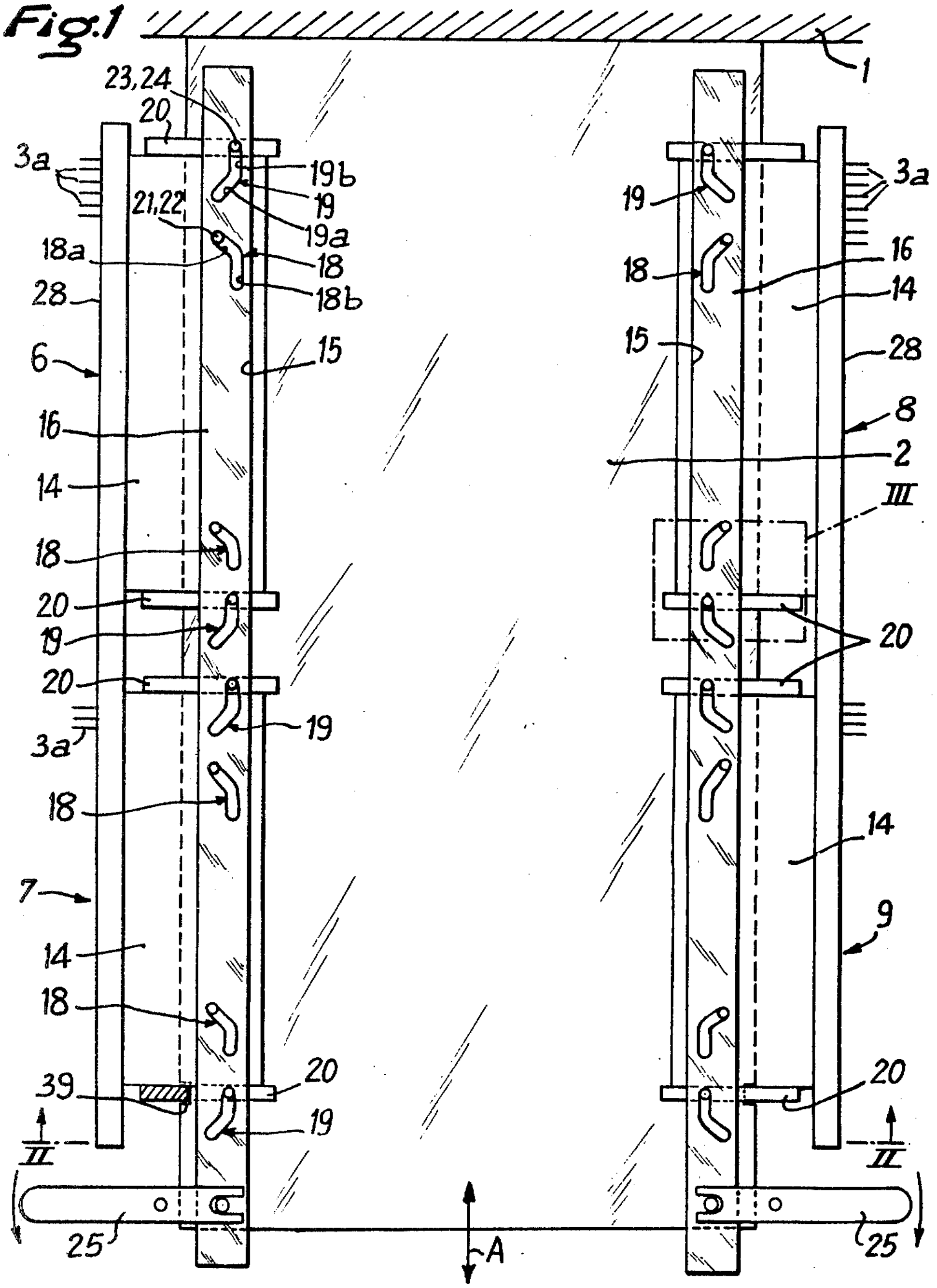
FIG. 1 is a plan view of a connection device constructed according to the invention, showing a printed circuit board positioned in the device.
Figure 2:
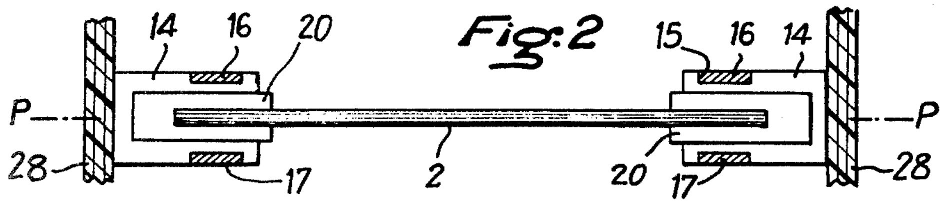
FIG. 2 is a section on the line II—II of FIG. 1.

The connection device, which is illustrated as a whole in FIGS. 1 and 2, comprises a rectangular frame 1, the only part of which illustrated, at the top of FIG. 1, is the side opposite to the side for the introduction of the printed circuit boards such as the board 2.

The direction of introduction and extraction of these boards is indicated diagrammatically by the double arrow A in FIG. 1. Apart from the introduction side, the frame has three sides, at least one of which carries at least one connector equipped with resilient contact members 3 (see FIGS. 3 and 5) orientated transversely with respect to the side of the frame in question. According to the form of embodiment in FIG. 1, the two sides of the frame parallel to the direction A each carry two connectors 6, 7, on the one hand, and 8, 9 on the other hand. The contact members 3 are adapted to touch, through an active region 4, conducting connection tracks 5 leading transversely to the adjacent side of the board, when the board occupies its working position shown in FIG. 1 and at the top of FIG. 5.

Figure 5:
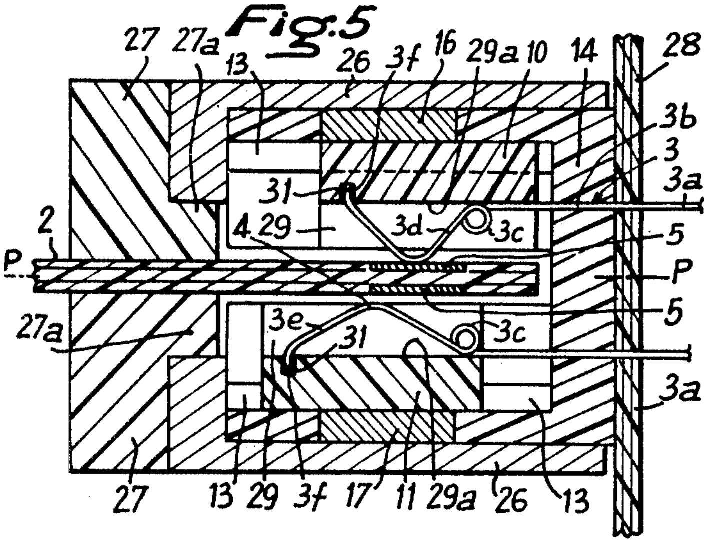
FIG. 5 shows, in cross section, the essential elements of FIG. 3, in two different positions of operation, the upper half of FIG. 5 corresponding to the closing of the contact members and the lower half to their opening.

Associated with each connector are two slides 10 and 11 of insulating material, which are symmetrical in relation to the mean plane of the frame, which plane is designated by P-P in FIGS. 2 and 5. These slides each have two dovetail tenons 12 (only one of which is visible in FIG. 3) which can slide in mortises 13 of corresponding shape formed in a U-shaped body 14, made of insulating material. This body is made in one piece for each of the connectors 6 to 9. Because of the dovetail shape of the tenons 12 and mortises 13, these slides 10, 11 are held automatically in the body 14 and cannot, in any circumstances, fall inside this. The contact members 3 therefore have no influence on the holding of the slides 10 and 11.

Provided on each of the upper and lower faces of each body 14 is a longitudinal groove 15 in which there can slide a sliding strip 16 or 17, generally of metal. As FIG. 1 shows, each sliding strip is common to the connectors 6, 7 or 8, 9 situated at one and the same side of the frame. As can be seen from FIGS. 3 and 5, at the level of their tenons 12, the slides 10, 11 are in direct contact with the sliding strip 16 or 17 whereas elsewhere they are in contact with the bottom of the groove 15. At the level of each connector 6 to 9, each sliding strip 16 or 17 comprises two guide grooves 18 adapted for the displacement of the slides 10, 11 and two guide grooves 19 adapted for the displacement of end-plates 20 which frame each connector 6 to 9. As FIG. 4 shows, each groove 18 and 19 has an inclined portion 18*a* or 19*a* in relation to the longitudinal direction of the sliding strip 16 or 17, which portion extends away from the interior of the frame 1, and a portion 18*b* or 19*b* parallel to this direction. Engaged in each groove 18 is a pin 21 which is rigidly connected to a slide 10 or 11 and carries a roller 22. Similarly, engaged in each groove 19 is a pin 23 rigidly connected to an end-plate 20, which may be of metal, and carrying a roller 24. Each end-plate 20 is equipped with a pin 23 at each side of the mean plane P. The whole is adapted in such a manner that, depending on the position of each sliding strip 16 or 17, either (as shown in FIG. 1) all the pins 21 are in an inclined portion 18*a* of the groove 18 of the sliding strip in question while all of the pins 23 are in a parallel portion 19*b* of the groove 19 of this sliding strip, or (as shown in FIG. 4) all the pins 21 are in a parallel portion 18*b* of the groove 18 while all the pins 23 are in an inclined portion 19*a* of the groove 19. The end-plates 20 cooperate with guide means which enable them to be displaced in translation in a direction orthogonal to the longitudinal direction of the sliding strips 16, 17 and parallel to the mean plane P. Moreover, each pair of sliding strips 16, 17 is equipped with a manipulating member, illustrated diagrammatically by a lever 25 in FIG. 1, which enables the operator to displace it longitudinally with a view to displacing the slides 10, 11 and the end-plates 20 transversely, as will be explained in detail hereinafter.

Figure 3:
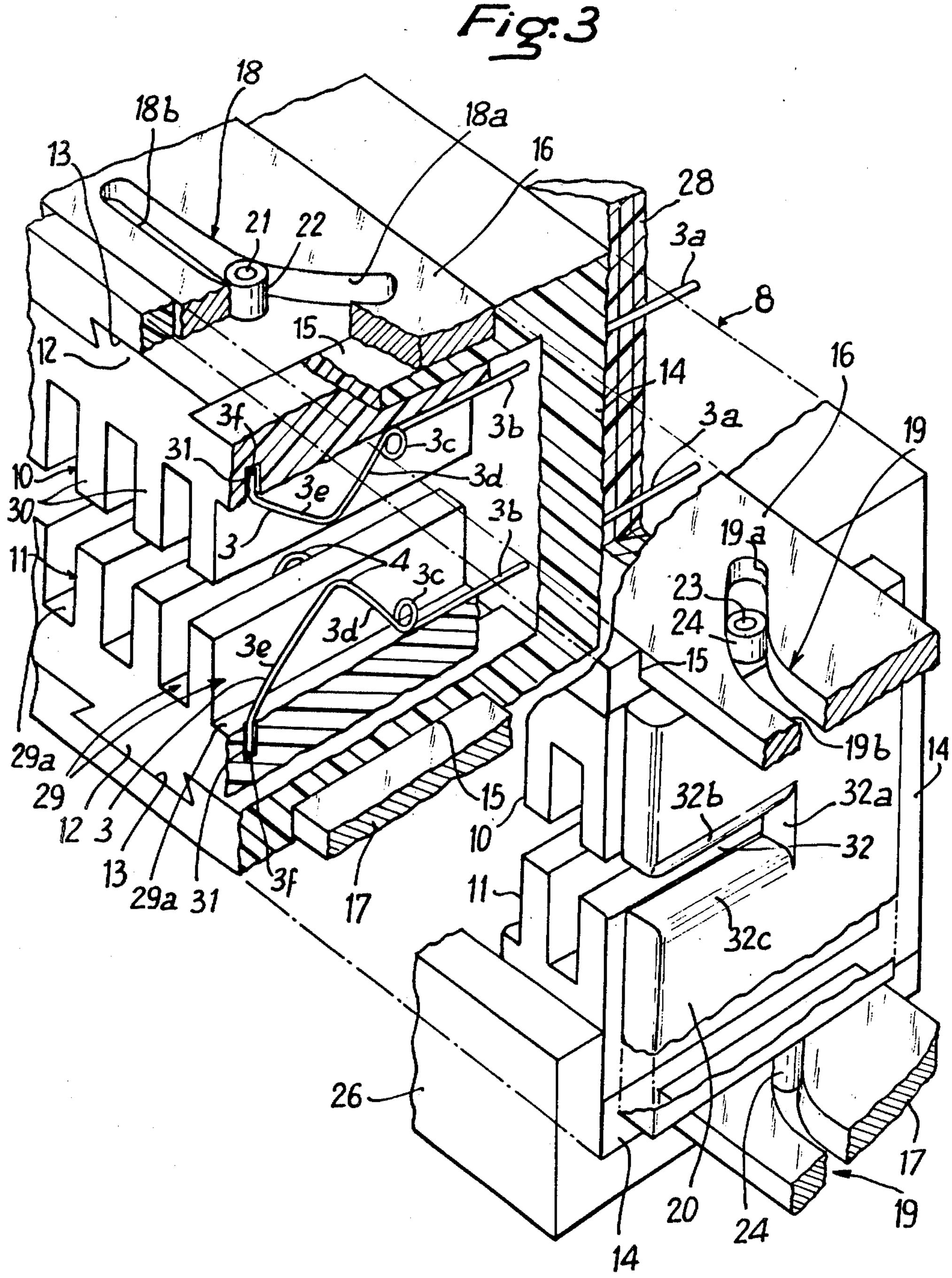
FIG. 3 shows, in perspective, with parts broken away, the portion of the connection device of FIG. 1 which is framed at III in FIG. 1.
Figure 4:
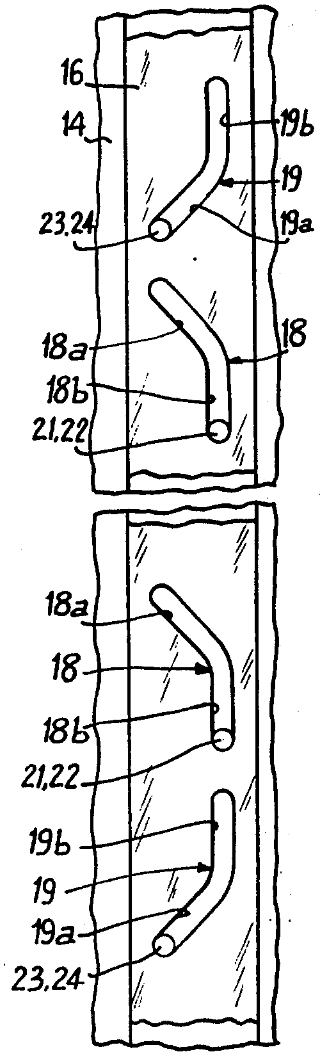
FIG. 4 shows, on a larger scale, with parts in section, the upper portion of the left-hand sliding strip of FIG. 1, but in its other extreme position.

At each side, the sliding strips 16, 17 of the connectors 6, 7 and 8, 9 are held by a pair of metal plates 26 (not shown in FIG. 1 but visible in FIG. 5, as in FIG. 3 for one of them). Between the flanges of the two plates 26 there is a gap, the height of which is greater than the thickness of the thickest printed circuit board 2, the latter being able to carry on each edge two gripping plates 27 which respectively have flanges 27*a* adapted to penetrate into said gap with a view to guiding the board 2. FIGS. 1 to 3 and 5 also illustrate an insulated plate 28, called a "mother board", on which there emerge the tails 3*a*. The oblique portion 3*e* ends with a short portion 3*f* substantially perpendicular to the bottom 29*a*. The terminal portion 3*f* is engaged in a blind hole 31 which is formed in the bottom 29*a*. Each member 3 is fixed to the body 14 through which it passes and ends against the plane bottom 29*a* of a notch 29 of rectangular section which is formed in the slide 10 or 11. The bottoms 29*a* of the slides 10 and those of the slides 11 are situated respectively in planes parallel to the mean plane P of the frame 1. The rectilinear portion 3*b* is adapted so that the bottom 29*a* can slide against it during the displacements of the slides. Associated with each member 3 is a notch 29 which is orientated orthogonally in relation to the longitudinal direction of the sliding strips 16, 17 and the width of which is only slightly greater than the width of the contact member 3, at least close to the active region 4. Each notch 29 is limited by the lateral faces of two teeth 30 of rectangular section, clearly visible in FIG. 3. Between the teeth 30 of the slides 10 and those of the slides 11, there is a gap sufficient to receive the edges of the board 2. The rectilinear portion 3*b* terminates in a loop or single turn 3*c*, after which the member 3 leaves the bottom 29*a* of the notch 29 by an oblique portion 3*d* which forms an obtuse angle with the rectilinear portion 3*b*. The oblique portion 3*d* is followed by a rounded portion which constitutes the active region 4, then by an oblique portion 3*e* substantially symmetrical with the oblique portion 3*d* in relation to a perpendicular on the bottom 29*a*. Finally, this oblique portion 3*e* ends with a short portion 3*f* substantially perpendicular to the bottom 29*a*. The terminal portion 3*f* is engaged in a blind hole 31 which is formed in this bottom 29*a*. Because of the presence of its loop 3*d* in particular, the contact member 3 has a resilient prestress, s that its terminal portion 3*f* is constantly urged towards the bottom of the hole 31, whatever the displacements which are imposed thereon by the slides 10, 11. According to whether the slide 10 or 11 occupies its opening position (bottom of FIG. 5), or closing position (top of FIG. 5), the active region 4 is set back or projects in relation to the apex of the teeth 30, by reason of the greater or lesser spacing existing between the loop 3*c* (fixed) and the terminal portion 3*f* (movable with the slide 10 or 11).

As FIG. 3 shows, each end-plate 20 has an opening 32 orientated towards the center of the frame 1. The outer edge 32*a* of each opening 32, as well as its upper 32*b* and lower 32*c* edges are chamfered or rounded at the side where the board 2 is introduced (lower side according to FIG. 1) with a view to facilitating the introduction and centering of the board 2. In each pair of end-plates 20 situated in the same vertical plane (plane perpendicular to the direction A of FIG. 1), the distance between the outer edges 32*a* is greater or less than the width of the board depending on the position imposed on the end-plates 20 by the sliding strips 16, 17.

Thus a connection device is obtained, the operation of which is as follows: Let it be assumed first of all that the sliding strips 16, 17 occupy the position shown in FIG. 1 for which, on the one hand the pins 21 are at the bottom of the oblique portions 18*a* of the grooves 18 associated with the slides 10, 11 and, on the other hand, the pins 23 are at the bottom of the parallel portions 19*b* of the grooves 19 associated with the end-plates 20. If it be assumed, likewise, that contrary to what is illustrated in FIG. 1, no board has been introduced into the connection device. The pins 21 and consequently the slides 10, 11 are therefore in their position furthest away from the inside of the frame 1, as illustrated in the upper portion of FIG. 5. In other words, for each contact member 3, the distance between the loop 3*c* and the terminal portion 3*f* is minimum: the active region 4 is therefore at the maximum distance from the bottom 29*a* of the notch 29 and it projects in relation to the teeth 30 of the slides. For the reasons explained above, it is therefore dangerous, for the maintenance of the contact members 3 and of the tracks 5 of the board 2, to introduce this board into the connection device. But, at the same time, the end-plates 20 are in their position closest to the interior of the frame. Between the outer edges 32*a* of the openings 32, considered in pairs, there is a gap which is smaller than the width of the board 2, making it impossible to introduce the board by mistake.

By displacing the levers 25 in the direction of the arrows in FIG. 1, or by actuating any other similar control member, the operator therefore first has to displace the sliding strips 16, 17 upwards in FIG. 1, into the position illustrated in FIG. 4. In the course of the first part of this movement, the pins 23 travel through the parallel portions 19*b* of the grooves 19 so that the end-plates 20 remain immobile. At the same time, the pins 21 travel through the inclined portions 18*a* of the grooves 18, which displaces the slides 10 and 11 towards the interior of the frame; thus, the slides 10, 11 pass from the position at the top of FIG. 5 to that at the bottom of the same FIG., for which the distance between loop 3*c* and terminal portion 3*f* is maximum, which retracts the active region 4 completely inside the notches 29. The contact members 3 are necessarily all open. In the course of the second part of said movement, the pins 21 travel through the parallel portions 18*b* of the grooves 18 so that the slides 10, 11 remain immobile. At the same time, the pins 23 travel through the oblique portions 19*a* of the grooves 19, which causes the end-plates 20 to occupy their position furthest away from the center of the frame. The operator can therefore introduce the board 2, which is facilitated by the chamfered or rounded shape of the edges 32*a*, 32*b*, 32*c* of the openings 32 in the end plates 20 (see FIG. 3). Once the board has arrived in the working position illustrated in FIG. 1, the operator displaces the levers 25 in the opposite direction to that of the arrows in FIG. 1. The result is the same movements as those described above but in the reverse order and direction. In other words, the end-plates 20 are first brought towards one another in such a manner as to lock the board which has notches 39 for this purpose (FIG. 1) into which the end-plates 20 can penetrate, then the slides 10, 11 are moved away from the center of the frame in such a manner as to close the contact members 3 (as shown at the top of FIG. 5). These contact members are therefore all forcibly closed with a resilient force which is determined in advance by their geometrical and resilient characteristics and by the amplitude of the travel of the slides 10, 11.

Needless to say, in order to extract the board 2 later, at least the first part of the maneuvers which have just been described is effected: opening of the contacts 3, then unlocking by moving apart of the end-plates 20.

Figure 6A:
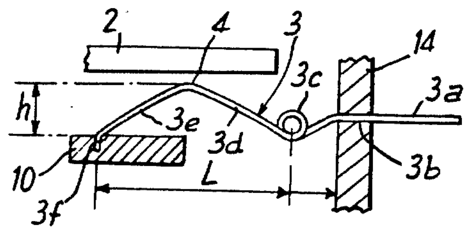
FIGS. 6*a* and 6*b* show diagrammatically, in cross section, a connector constructed substantially in accordance with FIG. 5, in two different positions of operation.
Figure 6B:
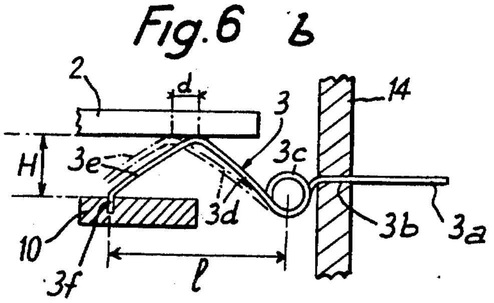

The self-cleaning action obtained according to the invention is illustrated in FIGS. 6*a* and 6*b*. FIG. 6*a* represents the contact member 3 in the open position and FIG. 6*b* in the closed position.

If a triangle is imagined, two sides of which are constituted by the oblique portions 3*d* and 3*e*, it will be found that the displacement of the slide such as 10, from the position of FIG. 6*a* to that of FIG. 6*b*, shortens the length of the third side (called imaginary side in the preamble) from the value "L" to the value l, and at the same time lengthens the height dropped on this third side from the value h to the value H. This lengthening of the height first causes the active region 4 to be brought into contact with the corresponding conducting connection track (position in chain line in FIG. 6*b*), then a slight displacement of this active region 4 in relation to the track in question, accompanied by an increase in the contact pressure (up to the position in full lines in FIG. 6*b*). This is explained by the fact that the turn 3*c*, under the effect of the thrust which is transmitted thereto by the portion 3*d*, moves closer to the illustrated portion of the body 14 in passing from the open position (FIG. 6*a*) to the closed position (FIG. 6*b*), and at the same time increases in diameter. The portion 3*d* therefore becomes shorter, which enables the portion 3*e*, terminated by the active region 4, to be displaced substantially without being deformed, from the position represented in dotted line to that represented in full line in FIG. 6*b*, that is to say, enables the active region 4 to wipe the conducting track of the board 2 over the distance d separating these last two positions. In order to facilitate the deformation of the turn 3*c*, it is preferable, contrary to the illustration of FIGS. 3 and 5, for it not to bear against the slide 10.

Figure 7:
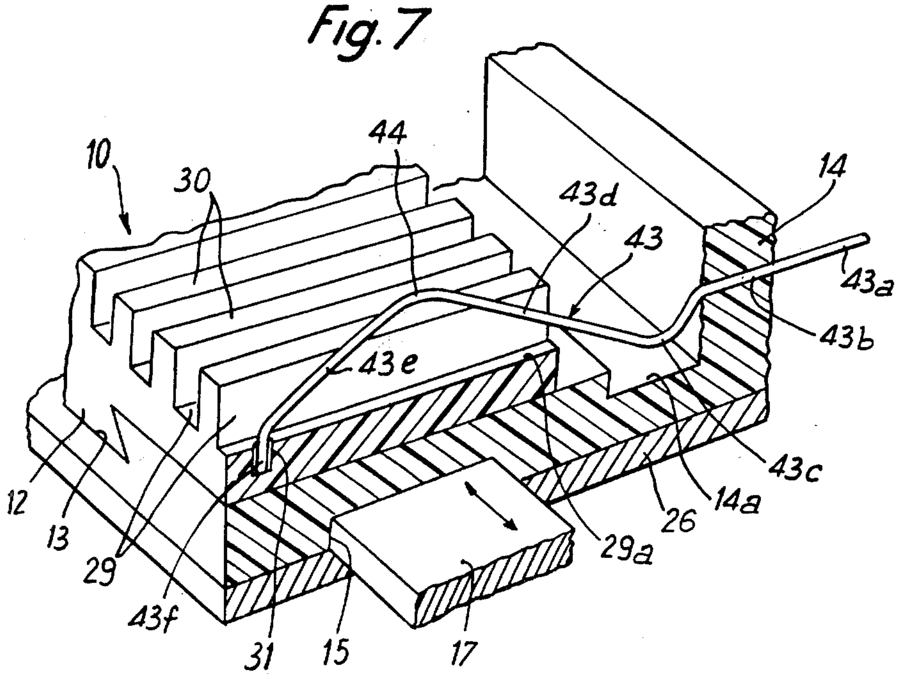
FIGS. 7, 8 and 9 show in perspective, partly in section, three connectors constructed in accordance with three further embodiments of the invention.
Figure 8:
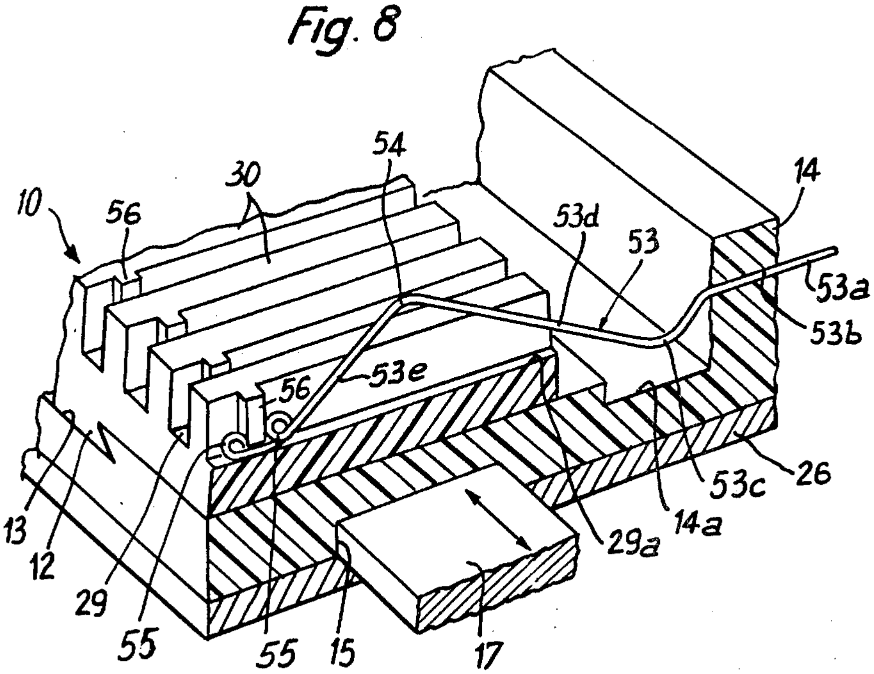
Figure 9:
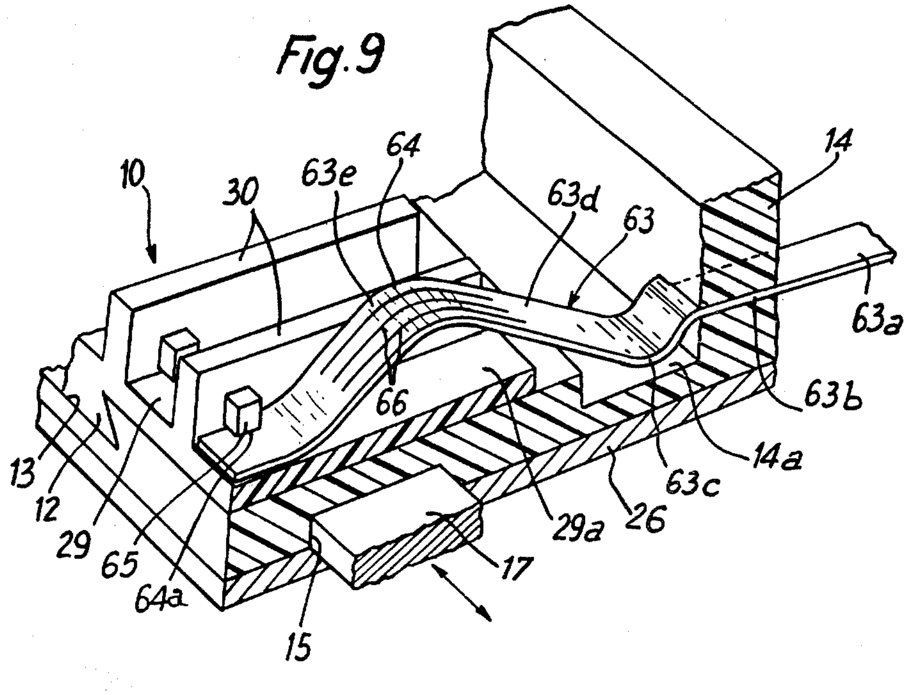

FIGS. 7, 8, and 9 represent three forms of embodiment which are different from one another and from that of the preceding figures. In FIGS. 7 to 9, the elements or portions similar to those which are designated by 3, 3*a* 3*b*, 3*c*, 3*d*, 3*e*, 3*f* and 4 in FIGS. 3, 5, 6*a* and 6*b*, are designated by the same reference numerals increased respectively by 40, 50 and 60.

Contrary to the various preceding forms of embodiment, the contact members 43, 53, and 63 do not have loops or turns such as 3*c*, which may have disadvantages when the electric currents which traverse the contact members are of very high frequency, but what it is agreed to call "flexibility folds", or reverse bends, 43*c*, 53*c* and 63*c* each consisting of the succession of at least two arcs of opposite curvature. Such flexibility folds, which are "portions forming a hinge" according to the terminology adopted in the preamble, have, among other advantages, that of a narrower width than the loops or turns. At the level of the flexibility folds 43*c*, 53*c* and 63*c*, the body 14 may be equipped with a channel 14*a*, perpendiculr to the mortises 13, to prevent these flexibility folds from touching the body and thus losing their deformation freedom. For the same reason, the assembly of the slide 10 and of the contact member is adapted in such a manner that the bottom 29*a* of the grooves 29 remains spaced apart from the adjacent portion 43*d*, 53*d*, 63*d* of the contact member.

According to the form of embodiment of FIG. 7, the contact member 43 is formed by a round wire (single or twisted) the end 43*f* of which is inserted in a blind hole 31 formed in the slide, in the same manner as in FIGS. 3, 5, 6*a* and 6*b*. According to a modification (not illustrated) relating to the case where no provision is made for possible dismounting and remounting of the contact member 43, the end 43*f* may be fixed either by soldering, using the holes 31 which have previously been metallized for this purpose, or by crimping the end 43*f* over the edge of the slide 10.

According to the form of embodiment of FIG. 8, the contact member 53 is likewise formed by a round wire, but its end is inserted in a different manner. For this purpose it has, at its free end, two tightened turns 55 forming two lateral projections which grip a rib 56 projecting inside the groove 29, perpendicular to the bottom 29*a*. In a similar manner to the preceding case, the prestressing to which the contact member 53 is subjected tends to hold its tightened turns 55 against the bottom 29*a* of the groove 29.

According to the form of embodiment of FIG. 9, the contact member 63 is formed by a metal strip. At its inserted end, this contact member has a lateral opening 64*a* into which there penetrates a rib 65 similar to the rib 56 of FIG. 6. The metal strip forming the contact member 63 preferably has a plurality of continuous longitudinal slits 66 at the level of the active region 64 and of a segment of the oblique portions 63*d* and 63*e*, in such a manner as to afford, with the conducting track of the board 2, as many contact regions as there are laminations bounded by these slits 66.

As in the case of FIGS. 6*a* and 6*b*, the contact member 43, 53 or 63 of FIGS. 7, 8 and 9 is subjected to a prestressing in such a manner that its inserted end is always under pressure against the bottom 29*a* of the groove 29 belonging to the slide 10. This, on the one hand, prevents this end from escaping from its insertion seating and, on the other hand, facilitates the placing in position or the replacement of the contact members in the connector. In spite of the absence of the turn 3*c* of FIGS. 3, 5, 6*a* and 6*b*, self-cleaning is ensured in the connector of each of the FIGS. 7, 8 and 9, as will be explained with reference to FIGS. 10*a* and 10*b*. It is simply to simplify the description that only the references of FIG. 7 have been included in FIGS. 10*a* and 10*b*. When the slide 10 is displaced from the position of FIG. 10*a* to that of FIG. 10*b*, a raising of the active region 44 is first caused, as already explained with reference to FIGS. 6*a* and 6*b*, until it touches the conducting track of the board 2 (as shown in chain line in FIG. 10*b*), after which the contact member 43 is deformed essentially at the level of the flexibility fold 43*c*, which enables the portion 43*c*, terminated by the active region 44, to be displaced in translation, ensuring the self-cleaning of the contact surfaces.

Figure 11A:
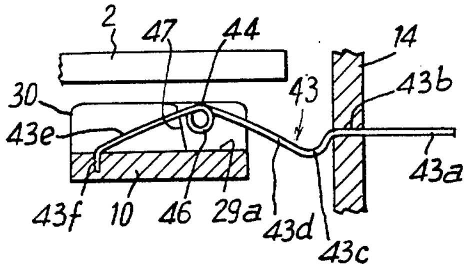
FIGS. 11*a* and 11*b* show, in diagrammatic cross section, a connector constructed in accordance with a fifth embodiment of the invention, in two different positions of operation.
Figure 11B:
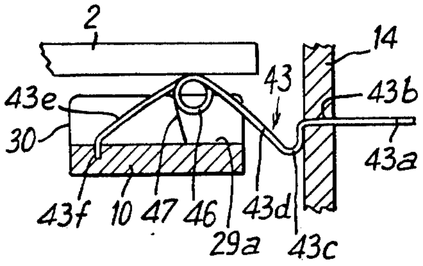

With reference to FIGS. 11*a* and 11*b* on the one hand and 12*a*, 12*b* and 12*c*, on the other hand, improvements will now be described according to which, when the slide such as 10 executes a displacement in the direction tending to close the contact members, it grasps a portion of the contact member in the course of this displacement which is entrained with it during the end of this displacement.

Figure 10A:
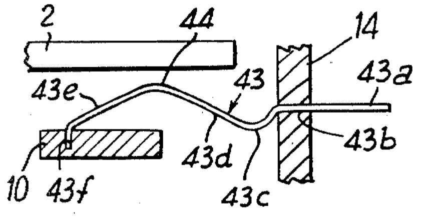
FIGS. 10*a* and 10*b* illustrate, in diagrammatic cross section, in two different positions of operation, the deformation of the contact members of the connector of FIG. 7.
Figure 10B:
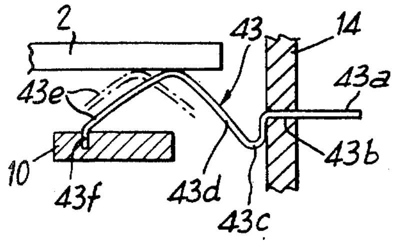

FIGS. 11*a* and 11*b* illustrate an embodiment of these improvements which is applied, by way of example, to a connector which, otherwise, is identical to that of FIGS. 7, 10*a* and 10*b*. According to this embodiment, the two inclined portions 43*d* and 43*e* of the contact member 43 are connected by a turn 46 which simultaneously forms the active region 44 and a bearing surface for a shoulder 47 carried by the slide 10 to enable it to grasp and entrain this turn 46. The shoulder 47 is preferably inclined in such a manner as to be substantially perpendicular to the portion 43*e* of contact member 43. The positions of FIGS. 11*a* and 11*b* correspond respectively to those of FIGS. 10*a* and 10*b*. In the course of its displacement in the closing direction (from the position of FIG. 11*a* to that of FIG. 11*b*), the shoulder 47 automatically engages the turn 46, the active region 44 of which sweeps the connecting track of the board 2 with an increasing pressure. The turn 46, the advantage of which is to insure a double contact with the connecting track, may be replaced by another deformation or any other system adapted to cooperate with the shoulder 47. The inclination of the latter increases the thrust of the turn 46 towards the connecting track.

Figure 12A:
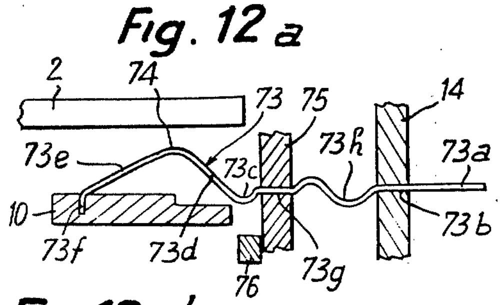
FIGS. 12*a*, 12*b*, and 12*c* show, in diagrammatic cross section, a connector constructed in accordance with a sixth embodiment of the invention, in three different positions of operation.
Figure 12B:
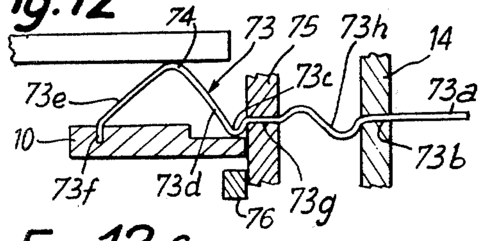
Figure 12C:
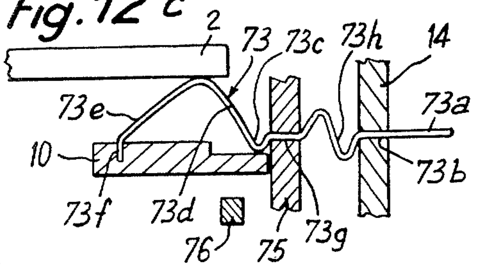

FIGS. 12*a*, 12*b* and 12*c* illustrate a modification of the preceding figures. The elements similar to those of FIGS. 10*a* and 10*b* are there designated by the same reference numerals increased by 30. In addition to the flexibility fold 73*c*, the contact member 73 of FIGS. 12*a*, 12*b*, 12*c*, has a flexibility fold 73*h*, the originality of which is to be situated between the body 14 and an insulating support 75, guided in translation, parallel to the path of the slide 10. Between the fold 73*h* and the portion 73*d*, the contact member 73 has a portion 73*q* inserted through the insulating support 75. The latter is urged, either by the resilience of the fold 73*h*, or by external resilient means, toward a stop 76, in the opening direction of movement of the slide 10. The insulating support 75 is situated in the path of the slide 10 in such a manner as to be entrained by this during its closing movement.

FIG. 12*a* represents the connector in its open position, the active region 74 being consequently spaced apart from the board 2. If the slide 10 is displaced from left to right, the support 75 remains at first held resiliently against the stop 76 and that portion of the member 73 which comprises the portions 73*d* and 73*e* therefore begins to be deformed in the same manner as in FIGS. 10*a* and 10*b*, until the position of FIG. 12*b* where the active region 74 has first come to touch resiliently the connecting track of the board 2 with an initial self-cleaning, then where the slide 10 has come to touch the support 75. In continuing its movement, the slide 10 reaches the position of FIG. 12*c*. Between FIGS. 12*b* and 12*c*, the assembly of the portions 73*d* and 73*e* is not subjected to any deformation, the active region 74 therefore remaining bearing with the same resilient force against the connection track. At the same time, the insulating support 75 is entrained towards the right by the slide 10, slightly flattening the flexibility fold 73*h*, and enabling the active region 74 to be displaced by the same distance, therefore ensuring the self-cleaning.

Figure 13A:
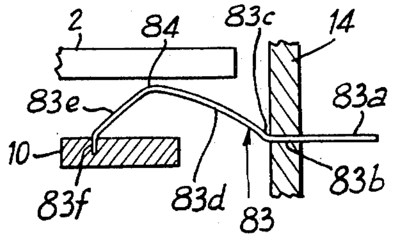
FIGS. 13*a* and 13*b* show, in diagrammatic cross section, a connector constructed in accordance with a seventh embodiment of the invention, in two different positions of operation.
Figure 13B:
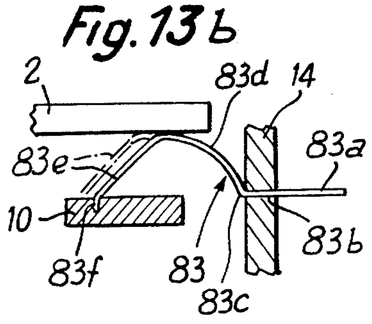

In the above, the portions forming hinges have been described in the form of loops or turns 3*c* or of flexibility folds 43*c*, 53*c* 63*c*, or 73*c*. Another embodiment of these portions forming a hinge is illustrated by way of example in FIGS. 13*a* and 13*b*. In these figures, the elements similar to those of FIGS. 6*a* and 6*b* have been designated by the same reference numerals, increased by 80. In this case, the portion 83*d*, adjacent to the body 14 is given a greater length combined with a certain initial curvature (see FIG. 13*a*), hence a greater flexibility than the portion 83*e* adjacent to the embedded end 83*f*, which is originally rectilinear. In this manner, when the slide 10 is displaced from the position of FIG. 13*a* to that of FIG. 13*b*, the active region 84 first comes into contact with the connection track of the board 2, then slides against this, increasing the curvature of the portion 83*d* of which the origin 83*c* thus constitutes a portion forming a hinge.

In short, as stated in the preamble, in all the forms of embodiment described above with reference to the accompanying drawings, the connectors have been designed to connect the conducting tracks of a printed circuit board 2 to resilient contact members such as 3, 43, 63, 53, 73, 83, carried by a frame rigidly connected to the body 14 and adapted to guide said board. The frame and the board 2 may be replaced respectively by two rigid insulating supports, one of which carries the resilient contact members and the other of which carries the connecting tracks, these supports being adapted to fit together so that one can be introduced into and extracted from the other by movement in a straight line. The supports could thus take the form of a rectangular or cylindrical cross section plug fitting into a corresponding socket. Since these plug-in connectors are of known type, the application of the contact members according to the invention to such connectors does not involve any difficulty to those skilled in the art; it has therefore not been considered necessary to illustrate the connectors thus improved in the accompanying drawings.

The invention is not restricted to the forms of embodiment described and illustrated. Thus, for example, it would be possible to have a number of connectors different from two on at least one of the sides of the frame parallel to the direction A of FIG. 1. Moreover, conventional connectors or those according to the invention could be mounted on the side of the frame opposite the introduction side, that is to say the side situated at the top of FIG. 1.

Finally, the gap between the flanges of the two plates 26 could have a height not only greater than the thickness of the thickest board 2 (as explained above), but sufficiently great to permit the passage of the contact members 3 with a view to their replacement.

According to the majority of forms of embodiment described above, the active region (contact region) 4 is single for each contact member 3. It would, however, be possible to multiply these contact regions by one of the following means:

either by a wire, the curvature of which is such that in the course of placing in position, this curvature tends to become a straight line over a certain length, thus leading to linear contact;

or by a wire comprising undulations, the crests of which would each come to touch the track 5;

or by such an embodiment of these undulations that, after placing in position, a linear contact can develop between the two crests of the undulations;

or by a twisted wire, the general profile of which remains constant, this wire being of round, rectangular, square section, etc.;

or by using two or more wires, twisted or not, and always having the same general profile;

or in accordance with one of the solutions illustrated in FIGS. 9 and 11*a*, 11*b*.

Figure 14A:
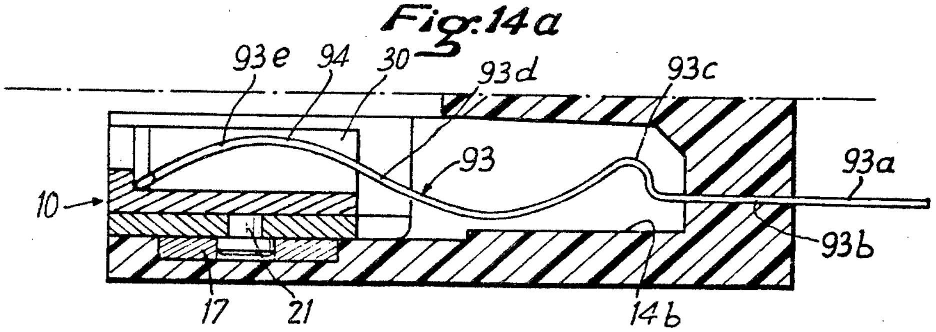
FIGS. 14*a* and 14*b* show, in diagrammatic cross section, a connector constructed in accordance with an eighth embodiment of the invention, in two different positions of operation.
Figure 14B:
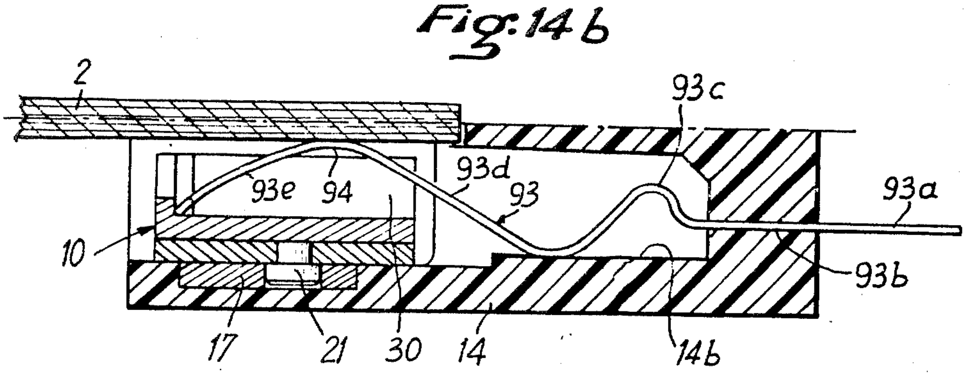

With reference to FIGS. 14*a* and 14*b* on the one hand and to FIGS. 15*a* and 15*b* on the other hand, improvements will now be described according to which, when the slide such as 10 moves in the direction tending to close the contact members, such as that designated here by 93, the flexibility folds or reverse bends, designated here by 93*c*, engage a surface parallel to the direction of reciprocation of the slide.

Such an engagement exerts an additional camming force for increasing the normal force effected between the active region 94 of the contact member 93 by producing a mechanical biasing force which would be supplementary to the normal force obtained by deforming the active region of the contact member into the conducting connection tracks on the printed circuit board 2.

Unlike the embodiments of FIGS. 7 to 9 where the body 14 is equipped with a channel 14*a* to prevent the flexibility folds (43*c*, 53*c* or 63*c*) from touching this body 14, the embodiment of FIGS. 14*a* and 14*b* has a body 14 which is provided with a surface 14*b* parallel to the direction of reciprocation of the slide 10 and facing the flexibility folds 93*c* at a radial distance such that, when the slide 10 is moved from the open position (FIG. 14*a*) to the closed position (FIG. 14*b*), the closest portion of the flexibility folds 93*c* engages this surface 14*b* about at the same time as that when the active region 94 engages the conducting track of board 2.

Figure 15A:
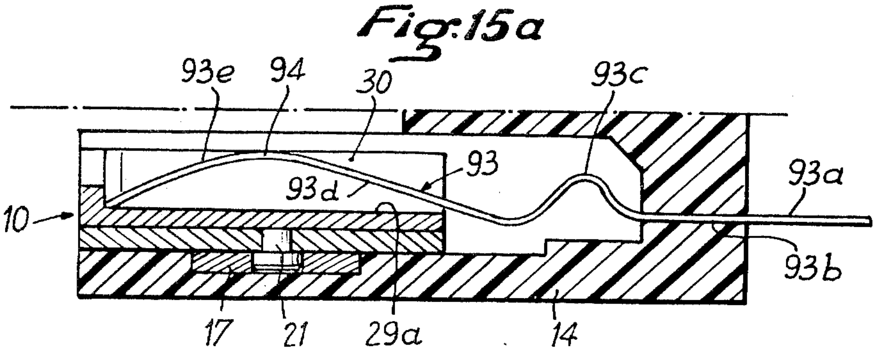
FIGS. 15*a* and 15*b* show, in diagrammatic cross section, a connector constructed in accordance with a ninth embodiment of the invention, in two different positions of operation.
Figure 15B:
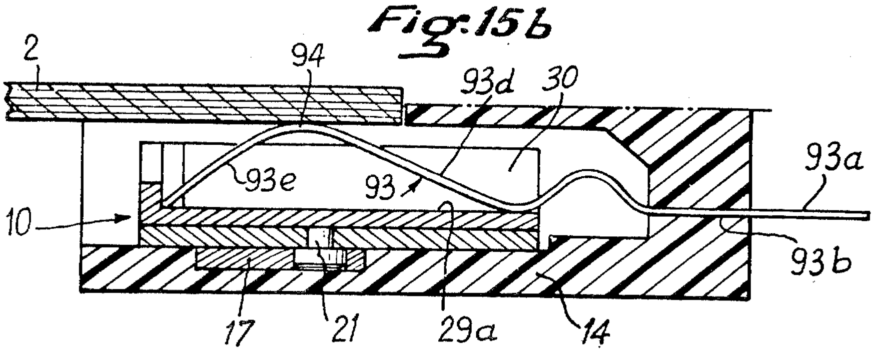

The embodiment of FIGS. 15*a* and 15*b* differs from that of FIGS. 14*a* and 14*b* in that the surface engaged by the flexibility folds 93*c* during the movement of the slide 10 from the open position (FIG. 15*a*) to the closed position (FIG. 15*b*) consists of the bottom 29*a* of the notch limited by teeth 30 in the slide 10.

Reference numerals 93*a*, 93*b*, 93*d*, 93*e* designate elements similar to those designated by 43*a*, 43*b*, 43*d*, 43*e*, or by 53*a*, 53*b*, 53*d*, 53*e*, etc., in the preceding figures.

The engagement of flexibility folds 93*c* with surface 14*b* (FIG. 14*b*) or with surface 29*a* (FIG. 15*b*) produces a mechanical biasing force which holds the active region 94 of each contact member 93 against the conducting track of board 2 even when the connection device is submitted to strong vibrations or to high positive or negative accelerations.

Figure 16:
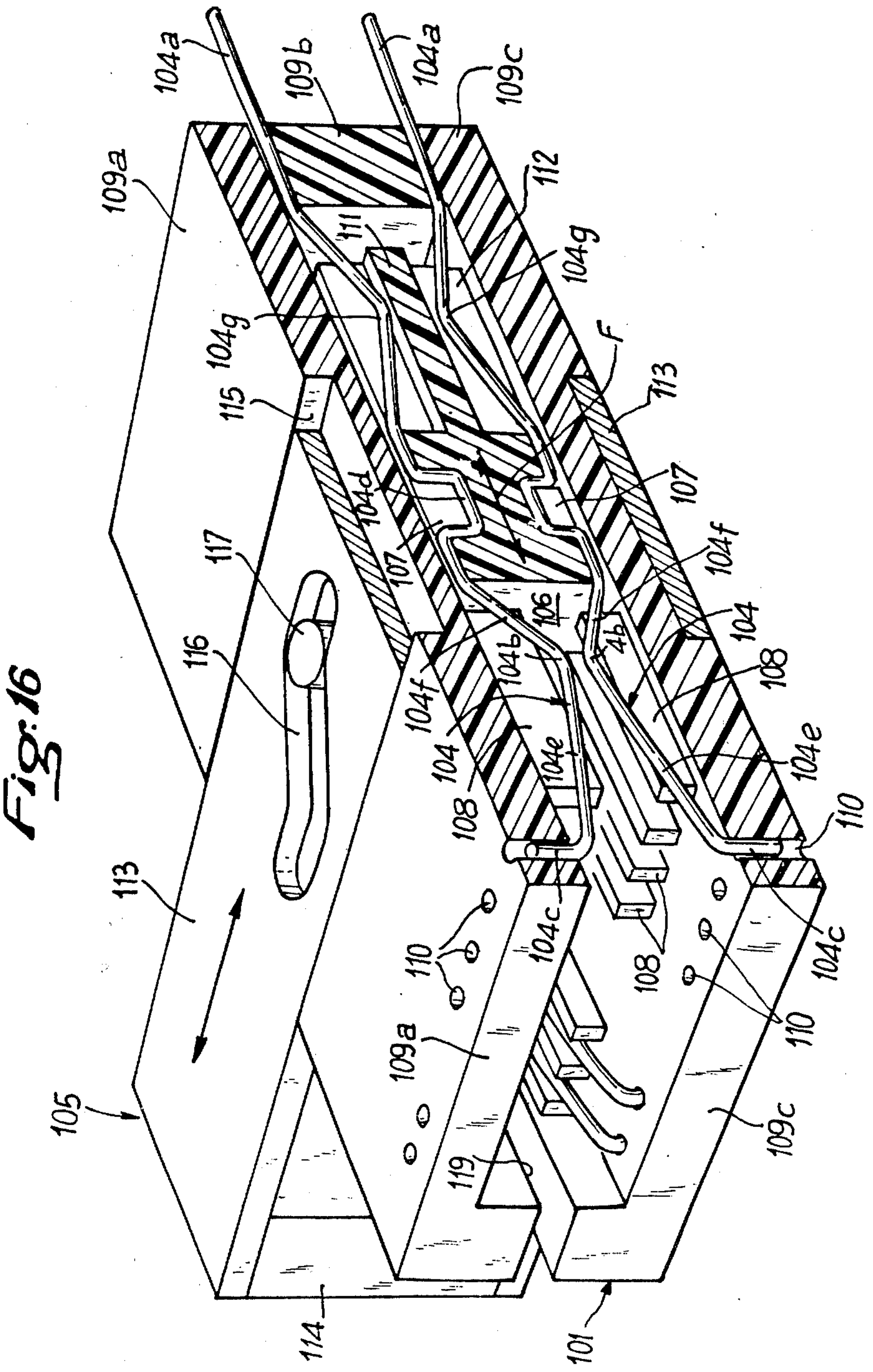
FIG. 16 shows, in partial perspective, a connection device according to the invention, which is sectioned through a plane perpendicular to the insertion and extraction plane and passing through two opposite contact members.
Figure 17:
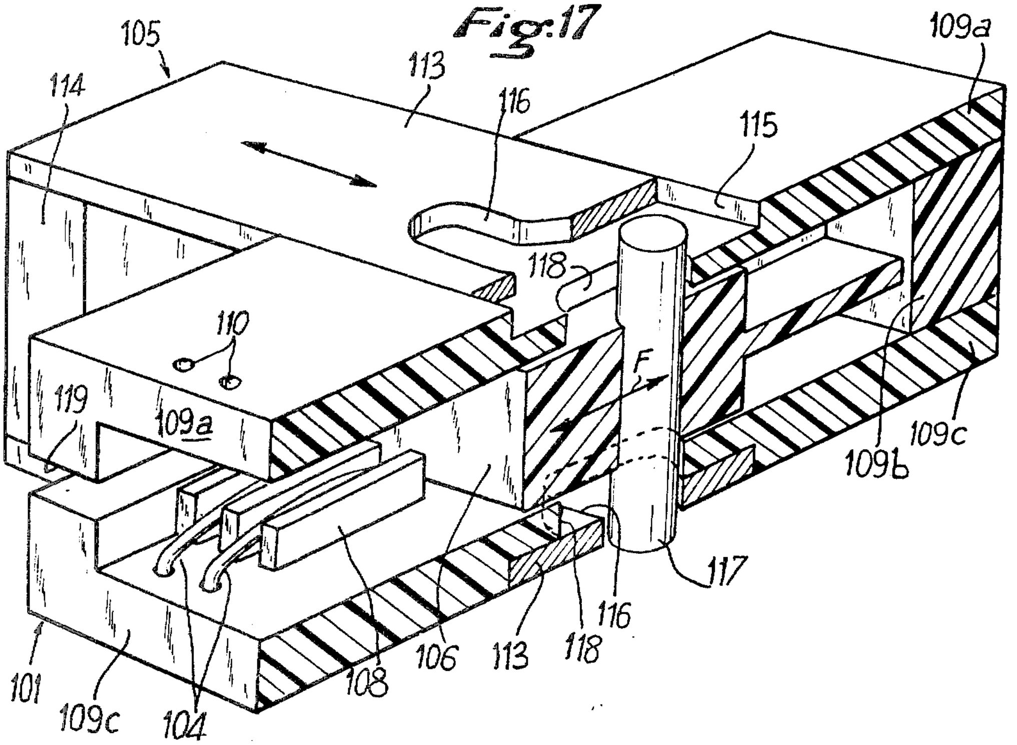
FIG. 17 shows, also in partial perspective, the same connection device which is sectioned through a plane parallel to the plane of section of FIG. 16 and passing through one of the drive axles of the slide.
Figure 18:
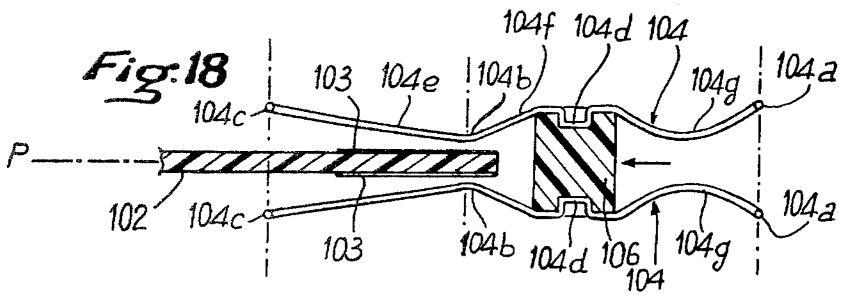
FIGS. 18, 19 and 20 illustrate successive phases of the closing movement of the contact members, by diagrammatic views in the plane of section of FIG. 16.
Figure 19:
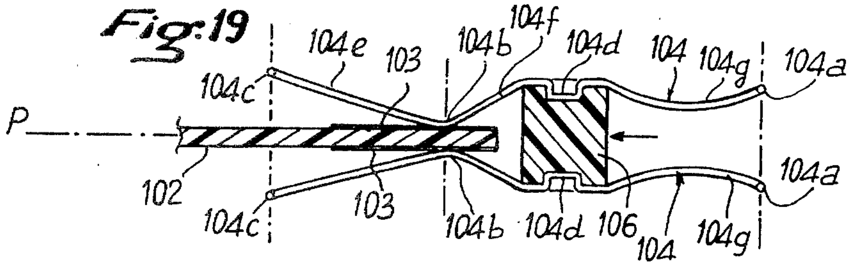
Figure 20:
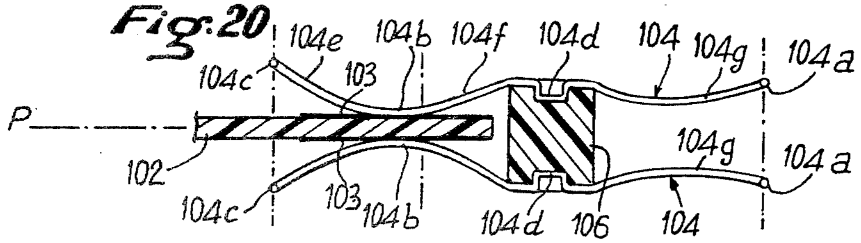

The connection device according to the invention (FIGS. 16–20) comprises a rectangular frame 101 of which there has only been shown, in FIGS. 16 and 17, one of the corners opposite the insertion side for printed circuit boards such as the board 102 of FIGS. 18 to 20. Such a board 102, which can be guided by the frame 101 in an insertion and extraction plane P, is provided with conducting connection tracks 103 on its two surfaces.

The frame 101 carries resilient contact members 104 of which a first end 104*a* is fixed with respect to the frame 101 and which are designed to touch respectively through an active region 104*b* with a suitable resilient force, the conducting connection tracks 103 when the board 102 has been suitably inserted into the frame 101.

The frame 101 bears in addition a control mechanism 105 operable to act on the contact members 104 alternately in the direction of opening and closing. This control mechanism comprises a slide 106 movable in translation parallel to the insertion and extraction plane P, as indicated by a double arrow F in each of FIGS. 16 and 17.

Each contact member 104 comprises, between a hinge-forming portion 104*c* and an anchoring portion 104*d* fixed with respect to the slide 106, two approximately rectilinear portions 104*e*, 104*f* which are inclined to one another and with respect to the plane P and whose junction constitutes the active region 104*b* of the contact member 104.

In accordance with the invention, on each contact member 104, the hinge-forming portion 104*c* is constituted by the second end of this member 104 and the anchoring portion 104*c*, fixed with respect to the slide 106, is separated from this second end by the two inclined portions 104*e* and 104*f*.

Considering that the board 102 needs only to reach the level of the active region 104*b*, that is to say well before the anchoring portion 104*d*, it is possible to make the control mechanism 105 comprise a single slide 6 which is symmetrical with respect to the plane P and to the two surfaces of which the anchoring portions 104*d* of all the contact members 104 are fixed. Thus, as is to be seen from the drawings, each anchoring portion 104*d* may be constituted by a permanent deformation, of rectangular profile for example, which is housed in a recess formed locally in the slide 106. Such a recess is limited by partitions 107, perpendicular to the plane P and parallel to the double arrow F, which help to prevent the corresponding contact member 104 from rotating on itself and to insulate the anchoring portions 104*d* electrically from one another. These recesses are preferably arranged in pairs in the same plane, such as the plane of section of FIG. 16.

Each contact member 104 is constituted by a metal wire and the slide 106 and/or the frame 101 possess guide means which act on its approximately rectilinear portions 104*e*, 104*f* so as to help, with the above-said partitions 107, to keep said portions constantly in the same plane, that is to say to prevent the concern contact member 104 from rotating on itself. In the embodiment shown, these guide means are constituted by partitions 108 which are borne by two parallel and opposite walls 109*a* and 109*c* of the frame 101. These parritions 108 could moreover be replaced or completed by similar partitions, carried by the slide 106. To facilitate the assembly of the connection device, the walls 109*a* and 109*c* and the bottom 109*b* of the frame 101 are constituted by separate parts, fixed together for example, by means of screws (not shown). In addition, the frame 101 may be provided, on its lateral surface, with an opening 119 enabling the insertion and extraction of the board 102 through this surface.

The hinge-forming portion or end 104*c* is folded at approximately right angles with respect to the plane P, away from the latter, and it is inserted into a hole 110 formed for this purpose in the walls 109*a* or 109*c* of the frame 101.

As is shown by FIGS. 16 and 17, the holes 110 pass through the walls 109*a* and 109*c* from side to side, which enables the ends 104*c* to be immobilized either by folding them at the exit from these holes, or by introducing an adhesive matter into the holes 110 through the outer surface of the walls 109*a* and 109*c*. To facilitate the self-cleaning of the active regions 104*b* of the conducting connection tracks 103, it is advantageous to give that portion 104*e*, depending from the hinge-forming portion 104*c*, a greater length than that portion 104*f*, depending from the anchoring portion 104*d*, so that the portion 104*e* is deformed preferentially with respect to the portion 104*f*.

Each contact member 104 comprises, between its first end 104*a* and its anchoring portion 104*d*, a portion 104*g* adapted to be deformed in a plane perpendicular to the insertion and extraction plane P. This portion 104*g* may be constituted for example by a circular arc, of variable radius (see FIGS. 18 to 20), or by two approximately rectilinear successive portions (see FIG. 16). As is to be seen from FIG. 16, the slide 106 is advantageously provided with an insulating plate 111 lying in the plane P, at the level of the deformable portion 104*g* of the contact members 104. Transverse partitions 112 may be formed on both sides of this plate 111 to guide the portions 104*g* in the course of their deformation and to insulate them electrically from one another.

As can be seen from FIGS. 16 and 17, the control mechanism 105 comprises two sliding strips 113, parallel to the length of the slide 106, which are fastened at their two ends by transverse members 114. These sliding strips 113 are housed in grooves 115 formed in the walls 109*a*, 109*c* of the frame 101 and open towards the outside of the latter, which grooves 115 guide the sliding strips 113 in translation. The latter are provided with oblique slots 116 which receive, in pairs, an axle 117 fast to the slide 106. The axle 117 passes through each wall 109*a* and 109*c* of the frame 101, at the level of its groove 115, through a transverse slot 118 so that this axle 117 is held so as to be only movable parallel to the translation movement of the slide 106 (double arrow F). Thus as can be seen from FIG. 16 (to the left), the presence of this axle 117 prevents contact members 104 from being placed at the same level as this axle. This is the reason why the rows of holes 110 and partitions 108 show a gap at this level.

The slide 106 is arranged to slide in contact with the inner surface of the walls 109*a*, 109*c* and it is provided with notches which enable the contact members 104 to enter the recesses bounded by the partitions 107 and to emerge therefrom.

A connection device is thus obtained which is assembled and operates in the following manner.

The assembly comprises the steps of:

placing the contact members 104 on the slide 106 and through the bottom 109*b*, the fixed ends 104*a* passing through this bottom 109*b*;

positioning of the walls 109*a* and 109*c*; and fixing the three parts 109*a*, 109*b*, and 109*c* of the frame 101 by a mechanical method (screws) or again by ultrasonic welding.

In the position shown in FIGS. 16, 17, and 18, each axle 117 (one at each end of the slide 106) is to be found at that end of a pair of slots 116 which causes the slide 106 to occupy its rightmost position. Consequently, the angle formed by the approximately rectilinear portions 104*e*, 104*f* of each contact member 104, is very obtuse and all the active portions 104*b* are kept away from the space swept by a board such as 102. It is hence possible to insert this board 102 into the frame 101 under zero insertion force conditions, that is to say without the active regions 104*b* rubbing on the conducting tracks 103 of the board 102. Once the latter is placed in position in the frame 101, the operator can actuate the control mechanism 105 so as to advance the sliding strips 113. By traversing the slots 116 and 118, each axle 117 is hence moved to the left of FIGS. 16 to 20 from the position of FIG. 18 to that of FIG. 20. In FIG. 19, the active regions 104*b* come into contact with the conducting connection tracks 103. Then, from the position of FIG. 19 to that of FIG. 20, the active regions 104*b* sweep over the tracks 103 from left to right. In fact, those portions 104*e*, which are the longest and consequently the most flexible, tend to be deformed whilst the portions 104*f* tend to accompany the movement of the slide 106 practically without being deformed. Such a self-cleaning effect has been earlier described in detail.

When the sliding strips 113 are then moved in the reverse direction, the elements of the device are moved or deformed in reverse order to resume eventually the positions shown in FIGS. 16 to 18. It is then possible to withdraw the board 102 to check it or to replace it by another.

Thus as can be seen from FIGS. 16 and 17, the connection device according to the invention has a small overall thickness which is equal to the sum of the thicknesses of the single slide 106 and of the two walls 109*a* and 109*c* of the frame 101, the presence of the grooves 115 enabling the sliding strips 113 to be accommodated within the thickness of the walls 109*a* and 109*c*.

The invention is not limited to the embodiment which has just been described with reference to FIGS. 16–20 of the accompanying drawings. Thus the contact member 104 could be constituted by a metal strip and not by a metal wire. Moreover, in order that portion 104*e* may be deformed preferentially with respect to the portion 104*f*, it is possible to act not on the respective lengths of these portions but on their respective thicknesses or on the orientation of their profile, in the manner previously indicated or in the manner indicated in my copending patent application Ser. No. 701,648, now U.S. Pat. No. 4,119,357, issued, Oct. 10, 1978.

Although the present invention has been illustrated and described in connection with a few selected example embodiments it will be understood that these are illustrative and not limitative of the invention. Those skilled in the art can make and are expected to make numerous revisions and adaptations and such revisions and adaptations are intended to be included within the scope of the following claims as equivalent to the invention.

What is claimed is:

1. An electrical connection device, comprising a first rigid insulating support, a second rigid insulating support provided with conducting tracks, and means forming a guide for insertion with zero insertion force of said second insulating support parallel to said first rigid insulating support whereby the second insulating support can be moved in both introduction and extracting directions, resilient contact members each having one end fixed in relation to the first support and constructed to engage resiliently, through an active region of the contact member, and make a slideable wiping contact with a respective one of the conducting connection tracks on the second support when one of the two supports has been introduced inside the other, a control mechanism having a positive mechanical connection with ends of the respective resilient contact members and operable to act on the resilient contact members alternately in a sense causing opening of the contacts and a sense causing closing of the contacts, to effect positive mechanical action in both directions of insertion and removal and in which the control mechanism comprises at least one movable slide and each contact member comprises, between a portion forming a hinge and a movable end operatively interconnected in the slide, two substantially rectilinear portions which are inclined to one another and to the direction of translation of the slide and which are guided transversely by the slide, and resiliently deformable to provide said slideably wiping contact, the junction of the two portions constituting the active region of the contact member which engages the confronting respective connection tracks.

2. A connection device as claimed in claim 1, in which the movable end of the contact member is held engaged in interconnecting seating relation provided for this purpose in the slide, under the effect of a prestressing force stored in the portion of said member forming the hinge.

3. A connection device as claimed in claim 1, in which the first support consists of a frame and the second support is constituted by a printed circuit board.

4. A connection device as claimed in claim 1 in which the portion of the contact member forming the hinge consists of a single turn.

5. A connection device as claimed in claim 1, in which the portion of the contact member forming a hinge consists of the succession of at least two arcs of opposite curvature.

6. A connection device as claimed in claim 1 in which the slide and each contact member are adapted in such a manner that, when the slide executes a displacement in the direction tending to close the contact members, it engages a portion of the contact member in the course of its displacement and is slideably engaged with it during the latter part of the displacement.

7. A connection device as claimed in claim 6, in which the contact member comprises successively, between its fixed end opposite to the movable end and the portion forming the hinge, a flexible fold formed by the succession of two arcs of opposite curvature and a portion embedded in an auxiliary support which is guided in translation parallel to the slide and which is urged toward a stop in the direction of the opening movement of the slide, the whole being such that, during the closing movement of the slide, the auxiliary support remains at first against its stop until the active region of the contact member comes into contact with the connection track, after which the slide entrains the auxiliary support by thrust while maintaining the relative position of the two inclined portions in relation to the slide.

8. A connection device as claimed in claim 6, in which the two inclined portions of each contact member are connected by a single turn which simultaneously forms the active region and also provides a bearing surface for a portion carried by said slide to grasp and entrain said turn.

9. A connection device as claimed in claim 8, including shoulder of the slide which is substantially perpendicular to that one of the inclined portions of the contact member which is terminated by the movable end.

10. An electrical connection device as claimed in claim 1, including an engaging surface parallel to the direction of reciprocation of said slide and disposed so as to be engaged by a portion of the contact member between its end fixed in relation to the first support and the proximate end of the adjacent substantially rectilinear portion, when said slide executes a displacement in the direction tending to close said contact members, whereby an additional force is developed to effect additional camming force between the active region of each contact member and the corresponding conducting track of the printed circuit board at the end of said displacement.

11. An electrical connection device as claimed in claim 10, in which said engaging surface is provided on the first rigid insulating support.

12. An electrical connection device as claimed in claim 10, in which said engaging surface is provided on the slide.

13. An electrical contact adapted for use in connection with printed circuit boards having at least one conductive connection track on the board, a resilient contact member having a relatively fixed captured first end and a relatively movable captured second end, two resilient portions extending respectively from said captured ends and joined by an active region of said contact member, and a control means for displacing one captured end of said contact member toward the relatively fixed captured end of said contact member to effect displacement of said active region into engagement with the conductive connection track on said board and effecting consecutively a linear engagement, and a controlled positive normal force of engagement which is succeeded by a sliding relative movement between the active region of said contact member and the confronting surface provided by the conductive connection track on said board.

14. The contact member of claim 13 in which the two portions of said contact member intermediate the respective captured ends and the active region of said contact member, are differentially resilient and such differential resilience is provided by a loop in the more resilient one of said portions.

15. The resilient contact member in accordance with claim 13 having a more resilient portion provided by reversely bending said portion.

16. The resilient contact member in accordance with claim 13 in which said contact member is formed of an arcuate shape, the crest of which constitutes the active region of said contact member.

17. A connection device adapted for use in combination with a connecting track of a printed circuit board or the like comprising a contact member having two substantially rectilinear inclined portions which intersect in a deformable active region adapted to engage a confronting surface of said connecting track and deformably engage the linear contact therewith, means for capturing one end of said contact member through a remote end of one of said portions, and means for both capturing and displacing a remote end of the other of said contact members to first effect a normal engagement between the confronting surfaces of said active region of said contact member and thereafter produce a relatively slideable movement between the deformed active region of its opposed connecting track surface.

18. An electrical connection device for printed circuit boards, comprising a frame including guide means, a printed circuit board adapted for insertion and extraction on said guide means, provided with conducting connection tracks on its two surfaces and which carries, on the one hand, resilient contact members each having a first end fixed with respect to said frame and arranged to engage respectively through an active region, with a suitable resilient force, the conducting connection tracks after the board has been suitably inserted into the frame and, on the other hand, a control mechanism having a positive connection with the resilient contact members and operable to act through said positive connections with the resilient contact members alternately in the direction of opening and closing, in which device the control mechanism comprises a slide movable in translation parallel to the insertion and extraction plane and wherein each said contact member comprises, between a hinge-forming portion and an anchoring portion fixed with respect to the slide, two portions approximately rectilinear at rest which are inclined between themselves and with respect to said plane and whose junction constitutes the active region of the contact member, and wherein, on each contact member, the hinge-forming portion is constituted by a second end of this member and in that the anchoring portion, fixed with respect to the slide, is separated from the second end by the two approximately rectilinear inclined portions.

19. A connection device as claimed in claim 18, in which the control mechanism comprises two sliding strips fastened to one another and guided in translation with respect to the frame, these sliding strips being provided with oblique slots in which a cam follower secured to the slide is engaged and held so as to be movable only parallel to the translation movement of the slide.

20. A connection device as claimed in claim 18, which comprises a single slide that is symmetrical with respect to the insertion and extraction plane and to the two surfaces of which the anchoring portions of all the contact members are fixed.

21. A connection device as claimed in claim 20, in which each contact member is constituted by a metal wire and the slide and/or the frame possess guide means which act on its approximately rectilinear portions so as to keep them constantly in the same plane.

22. A connection device according to claim 21, in which the hinge-forming end of the wire is folded approximately at right-angles with respect to the insertion and extraction plane, away from the latter, and inserted in an opening formed in the frame for this purpose.

23. A connection device as claimed in claim 20, in which each contact member comprises, between its first end and its anchoring portion, a portion deformable in a plane perpendicular to the insertion and extraction plane.

24. A connection device as claimed in claim 23, in which the slide is provided with an insulating plate situated in the insertion and extraction plane, at the level of the deformable portions of the contact members.

25. A method for effecting electrical connections with printed circuit boards having at least one conductive connection track on the board comprising the steps of:

inserting the printed circuit board with zero insertion force into an operative fixed position;

capturing, through positive connections, the relatively movable remote ends of a resilient contact member having rectilinear obtusely related portions extending respectively from said captured remote ends and joined by an active region of said contact member; and displacing one of said remote ends toward the other remote end to effect sequentially a linear engagement between said active region and a confronting surface provided by a connection track of said circuit board, a controlled normal force of engagement between said active region and track and a subsequent sliding relative movement therebetween.

26. The process in accordance with claim 25 including the step of:

camming an additional section of said contact member in the direction of said connection track to effect additional normal force of engagement between said active region and the opposed complementary confronting surface provided by said track.

27. The process in accordance with claim 25 wherein the capturing of one portion of said contact member is by insertion of a multi-angled portion within a relatively fixed member and said displacing is effected by camming the member holding the relatively movable captured end of said resilient contact toward the captured relatively fixed end thereof.

* * * * *